United States Patent [19]
Kobayashi et al.

[11] Patent Number: 5,136,123
[45] Date of Patent: Aug. 4, 1992

[54] MULTILAYER CIRCUIT BOARD

[75] Inventors: Satoru Kobayashi, Hitaka; Masahiro Suzuki, Tokorozawa; Satoshi Tanaka, Sayama; Tetsuya Hirose, Hitaka, all of Japan

[73] Assignee: Junkosha Co., Ltd., Tokyo, Japan

[21] Appl. No.: 172,256

[22] Filed: Mar. 23, 1988

[30] Foreign Application Priority Data

Jul. 17, 1987 [JP] Japan ................ 62-109601
Jul. 17, 1987 [JP] Japan ................ 62-109602

[51] Int. Cl.⁵ ........................................... H05K 1/02
[52] U.S. Cl. ........................ 174/258; 174/110 FC; 174/117 FF; 331/1 R; 361/414
[58] Field of Search ............ 361/397, 414; 174/68.5, 174/110 F, 110 FC, 117 F, 117 FF, 255, 256, 258, 268; 333/1, 161, 236, 238, 243

[56] References Cited

U.S. PATENT DOCUMENTS

| | | | |
|---|---|---|---|
| 3,740,678 | 6/1973 | Hill | 361/414 X |
| 3,777,221 | 12/1973 | Tatusko et al. | 361/414 X |
| 4,314,002 | 2/1982 | Oizumi et al. | 174/68.5 X |
| 4,382,236 | 5/1983 | Suzuki | 174/117 FF X |
| 4,423,282 | 12/1983 | Suzuki et al. | 174/110 F X |
| 4,490,690 | 12/1984 | Suzuki | 333/238 X |
| 4,560,962 | 12/1985 | Barrow | 333/238 X |
| 4,639,693 | 1/1987 | Suzuki et al. | 333/238 X |
| 4,640,866 | 2/1987 | Suzuki | 361/414 X |
| 4,675,789 | 6/1987 | Kuwabara et al. | 174/68.5 X |
| 4,701,576 | 10/1987 | Wada et al. | 174/117 F |
| 4,707,671 | 11/1987 | Suzuki et al. | 333/238 X |
| 4,710,854 | 12/1987 | Yamada et al. | 361/414 X |
| 4,755,911 | 7/1988 | Suzuki | 361/414 |
| 4,770,922 | 9/1988 | Hatakeyama et al. | 174/68.5 X |

FOREIGN PATENT DOCUMENTS

| | | | |
|---|---|---|---|
| 2644252 | 3/1978 | Fed. Rep. of Germany | 174/117 F |
| 3433834 | 3/1985 | Fed. Rep. of Germany | 174/117 F |
| 56-161701 | 12/1981 | Japan | 333/238 |

Primary Examiner—Gerald P. Tolin
Attorney, Agent, or Firm—E. Alan Uebler

[57] ABSTRACT

A multilayer circuit board is provided having an inner porous fluororesin layer containing electrical circuits, a ground conductor layer located adjacent the fluororesin layer on one side thereof and a power supply conductor layer located adjacent the fluororesin layer on the other side thereof, and a reinforcing, solid plastic dielectric layer adjacent each conductor layer and being external to the inner fluororesin layer. In an alternate embodiment, the multilayer circuit board may have a plurality of inner porous fluororesin layers, at least one fluororesin layer containing electrical circuits, and may have ground conductors and power supply conductors adjacent each fluororesin layer, and reinforcing, solid plastic dielectric layers on the outermost surfaces of the circuit board assembly. The ground and power supply conductor layers extend over the entire surfaces, respectively, of the inner fluororesin layers.

4 Claims, 1 Drawing Sheet

MULTILAYER CIRCUIT BOARD

BACKGROUND OF THE INVENTION

The present invention concerns a multilayer circuit board which can be appropriately used in high-frequency, electric signal transmission equipment such as electronic equipment, communications equipment and electronic computers.

One of the present applicants, Satoru Kobayashi, has been involved in the development of high-frequency circuit boards, and has proposed a multilayer circuit board which prevents an increase in signal propagation lag time by using a porous material for a dielectric which is inserted between adjacent printed circuit boards, disclosed in Japanese Utility Model Nos. 62-49,277 and 62-65,879 (which correspond to U.S. Pat. No. 4,755,911).

Conventionally, circuit boards which use a porous material as a substrate have been superior in terms of electrical characteristics such as propagation lag time. In such cases, however, because the substrate itself is soft and spongy, the circuit board has little resistance to bending stress when a multilayer arrangement is formed. Thus, such circuit boards have been considered inappropriate for use in multilayer configurations.

The present invention was designed in light of the abovementioned drawbacks encountered in the prior art. The object of the present invention is to provide a multilayer circuit board which is superior in terms of electrical characteristics such as propagation lag time, and which is also superior in terms of mechanical strength characteristics.

SUMMARY OF THE INVENTION

A multilayer circuit board is provided comprising an inner, porous fluororesin layer containing electrical circuits, a ground conductor layer located adjacent to the fluororesin layer on one side thereof and a power supply conductor layer located adjacent the fluororesin layer on the other side thereof, and a reinforcing, solid plastic dielectric layer adjacent each conductor layer and being external to the inner fluororesin layer. The circuit board preferably comprises a plurality of inner, porous fluororesin layers, at least one fluororesin layer containing electrical circuits, and may have ground conductors and power supply conductors adjacent each fluororesin layer, and reinforcing, solid plastic dielectric layers on the outermost surfaces of the circuit board assembly. The dielectric layers may be of a thermosetting resin, a polyimide resin or a glass epoxy.

DETAILED DESCRIPTION OF THE INVENTION AND PREFERRED EMBODIMENTS WITH REFERENCE TO THE DRAWINGS

A multilayer circuit board is provided having an inner porous fluororesin layer containing electrical circuits, a ground conductor layer located adjacent the fluororesin layer on one side thereof and a power supply conductor layer located adjacent the fluororesin layer on the other side thereof, and a reinforcing, solid plastic dielectric layer adjacent each conductor layer and being external to the inner fluororesin layer. In an alternate embodiment, the multilayer circuit board may have a plurality of inner porous fluororesin layers, at least one fluororesin layer containing electrical circuits, and may have ground conductors and power supply conductors adjacent each fluororesin layer, and reinforcing, solid plastic dielectric layers on the outermost surfaces of the circuit board assembly. The ground and power supply conductor layers extend over the entire surfaces, respectively, of the inner fluororesin layers.

The present invention was designed in light of the abovementioned drawbacks encountered in the prior art, and comprises a multilayer circuit board which is equipped with: (a) a porous fluororesin layer containing electrical circuits; (b) a ground conductor layer and a power supply conductor layer adjacent to this porous fluororesin layer; and (c) a reinforcing dielectric layer which is adjacent to these conductor layers.

In the present invention, electrical circuits are formed in a porous fluororesin layer. Accordingly, the electrical characteristics of the conductive pathways of these electrical circuits are determined by the characteristics of the aforementioned porous fluororesin layer, which has a superior dielectric constant and dielectric loss tangent. As a result, electrical signals propagated through these electrical circuits have a short leg time and small energy loss.

Furthermore, a reinforcing dielectric layer is laminated with the aforementioned porous fluororesin layer, with a conductor layer interposed between the dielectric layer and the fluororesin layer. Accordingly, when a multilayer circuit board is formed, the aforementioned reinforcing dielectric layer, which is preferably formed of a thermosetting resin, resists bending stress. Thus, a circuit board which is superior in terms of resistance to bending stress is obtained, and since the circuit board is shielded by the aforementioned conductor layer, there are no harmful effects on the electrical characteristics of the electrical circuits.

Figure 1:
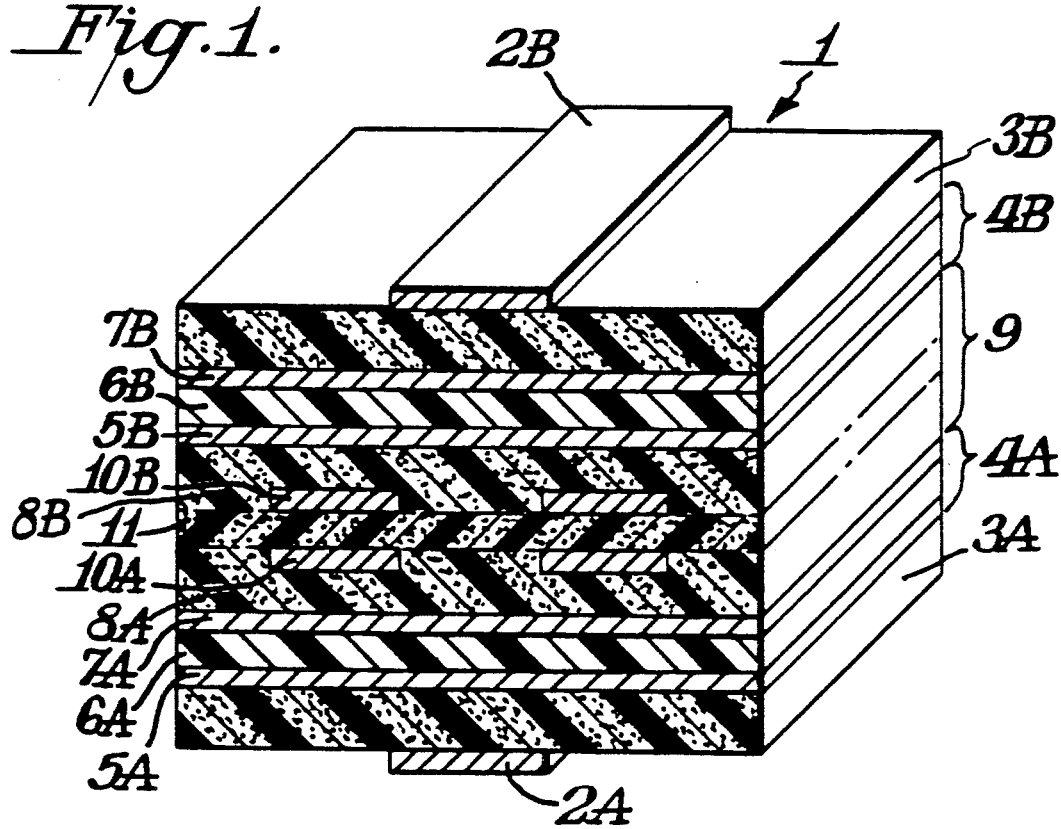
FIG. 1 is a perspective view, partly in cross-section, of one embodiment of the multilayer circuit board according to the invention.

FIG. 1 is a schematic illustration, partly in cross-section, which illustrates the structure of one multilayer circuit board of the present invention.

To describe this embodiment of the present invention with reference to FIG. 1, a multilayer circuit board 1 is formed by laminating, in the order listed, (a) a surface layer 2A of copper, (b) a prepreg sheet 3A of expanded, porous tetrafluoroethylene resin (as disclosed in U.S. Pat. No. 3,953,566 and hereinafter referred to as "EPTFE") sheet, (c) a copper-covered laminated composite sheet 4A which is formed by bonding a power supply conductor layer 5A and a ground conductor layer 7A, both of copper, to the respective surfaces of a prepreg sheet 6A of a polyimide which forms a reinforcing dielectric layer, (d) a prepreg sheet 8A of EPTFE, (e) a prepreg sheet 11 of EPTFE and which has electrical circuits 10A, 10B of copper formed on both sides, (f) a prepreg sheet 8B of EPTFE, (g) a copper-covered laminated composite sheet 4B which is formed by installing a power supply conductor layer 5B and a ground conductor layer 7B, both of copper, on the respective surfaces of a prepreg sheet 6B of a polyimide, (h) a prepreg sheet 3B of EPTFE, and (i) a surface layer 2B of copper. Here, the prepreg sheets 8A, 8B and 11 form the aforementioned porous fluororesin layer.

The electrical circuits 10A and 10B are sandwiched between the respective prepreg sheets 8A, 11 and 8B, which are EPTFE sheets having superior electrical characteristics, i.e. specific inductive capacity, dielectric loss tangent, etc. Accordingly, the electrical signals which are propagated through the electric circuits 10A, 10B have a short lag time and small energy loss.

Furthermore, the aforementioned copper-covered laminated composite sheets 4A and 4B both have prepreg sheets 6A, 6B of a polyimide which are laminated into integral units to form reinforcing dielectric layers. Accordingly, even if a bending force is applied to the multilayer circuit board 1, the prepreg sheets 6A, 6B of a polyimide resist this bending force and support the laminated structure. As a result, thee are few problems associated with distortion or contraction of the prepreg sheets of EPTFE, and the favorable characteristics of the electrical signals propagated through the electrical circuits 10A, 10B are not lost.

In the present invention, as described above, electrical circuits are formed in a porous fluororesin layer. Accordingly, the electrical characteristics of the conductive paths of these electrical circuits are determined by this porous fluororesin, which has a superior dielectric constant and dielectric loss tangent. As a result, the electrical signals which are propagated through the aforementioned electrical circuits have a short lag time and small energy loss.

Furthermore, reinforcing dielectric layer are formed which use a thermosetting resin as a constituent element. Accordingly, when a multilayer circuit board is constructed which combines these reinforcing dielectric layers with the aforementioned porous fluororesin layer, the reinforcing dielectric layers resist bending stress, so that a multilayer circuit board with superior resistance to bending stress is obtained.

In the present invention, in other words, the problem of the low mechanical strength characteristics of EPTFE, which has superior dielectric characteristics, is remedied by reinforcement with a dielectric of a thermosetting resin so that a multilayer circuit board with stable superior electrical characteristics is obtained. As a result, the present invention provides useful multilayer circuit boards using EPTFE sheets, which have conventionally been considered difficult to use in multilayer configurations, as dielectrics.

The present invention is not limited to the example of application described above. Various modifications might be made within the technical spirit of the present invention. For example, it would also be possible to obtain a multilayer circuit board with a superior resistance to bending stress and a superior surface hardness by using reinforcing dielectric layers both as interior layers and as outermost layers.

Figure 2:
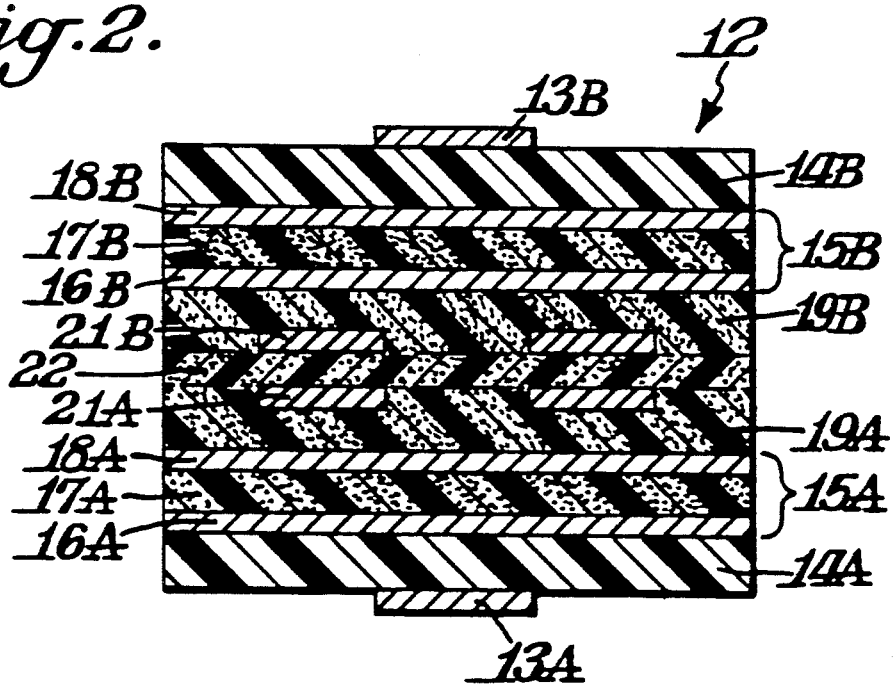
FIG. 2 is a cross-sectional view of another embodiment of the circuit board of the invention.

One such alternate construction is shown in FIG. 2 wherein a multilayer circuit board 12 is formed by laminating, in the order listed, (a) a surface layer 13A of copper, (b) a reinforcing dielectric layer 14A of a glass epoxy, (c) a copper-covered laminated sheet 15A which is formed by bonding a power supply conductor layer 16A and a ground conductor layer 18A, both of copper, to the respective surfaces of a prepreg sheet 17A of an expanded, porous tetrafluoroethylene (EPTFE) sheet, (d) a prepreg sheet 19A of an EPTFE sheet, (e) a prepreg sheet 22 which has electrical circuits 21A and 21B, both of copper, on the respective surfaces thereof (f) a prepreg sheet 19B of an EPTFE sheet, (g) a copper-covered laminated sheet 15B which is formed by bonding a power supply conductor layer 16B and a ground conductor layer 18B, both of copper, to the respective surfaces of a prepreg sheet 17B of an EPTFE sheet, (h) a reinforcing dielectric layer 14B of a glass epoxy resin, and (i) a surface layer 13B of copper.

The electrical circuits 21A and 21B are sandwiched between prepreg sheets of EPTFE. Accordingly, the electrical signals which are propagated through these electrical circuits 21A, 21B have a short lag time and small energy loss. In this case, since reinforcing dielectric layers 14A, 14B are installed as the outermost layers, the surface hardness of the multilayer circuit board 12 is determined by these reinforcing dielectric layers 14A, 14B. As a result, the surface hardness is greatly improved compared to cases where a multilayer circuit board is constructed exclusively of prepreg sheets of EPTFE. Thus, attachment of the circuit board to equipment and mounting of electronic parts are facilitated, and reliability is improved.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A multilayer circuit board comprising a plurality of inner, porous fluororesin layers, at least one said inner, porous fluororesin layer containing electrical circuits, ground conductors and power supply conductors in contact with and immediately adjacent each fluororesin layer, and reinforcing, solid plastic dielectric layers on the outermost surfaces of the circuit board assembly.

2. The circuit board of claim 1 wherein said reinforcing, solid plastic dielectric layers are of a thermosetting resin.

3. The circuit board of claim 1 wherein said reinforcing, solid plastic dielectric layers are of a polyimide resin.

4. The circuit board of claim 1 wherein said reinforcing, solid plastic dielectric layers are of a glass epoxy.

* * * * *